(12) United States Patent
Tsai et al.

(10) Patent No.: US 7,725,092 B2
(45) Date of Patent: May 25, 2010

(54) DYNAMIC CURRENT STEERING MIXER

(75) Inventors: Ming-Da Tsai, Miaoli Hsien (TW);
Yen-Horng Chen, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 536 days.

(21) Appl. No.: 11/697,347

(22) Filed: Apr. 6, 2007

(65) Prior Publication Data

US 2008/0248775 A1    Oct. 9, 2008

(51) Int. Cl.
*H04B 15/00*    (2006.01)
*H04B 1/26*    (2006.01)

(52) U.S. Cl. .................. 455/313; 455/323; 455/333

(58) Field of Classification Search ......... 455/313–326, 455/333
See application file for complete search history.

(56) References Cited

U.S. PATENT DOCUMENTS

| | | | | |
|---|---|---|---|---|
| 5,548,840 | A * | 8/1996 | Heck | 455/326 |
| 5,859,559 | A * | 1/1999 | Hong et al. | 327/359 |
| 6,370,372 | B1 * | 4/2002 | Molnar et al. | 455/323 |
| 6,438,365 | B1 * | 8/2002 | Balteanu | 455/326 |
| 6,510,314 | B1 * | 1/2003 | Kuo | 455/326 |
| 6,591,093 | B1 * | 7/2003 | Coffing et al. | 455/319 |
| 6,639,447 | B2 * | 10/2003 | Manku et al. | 327/359 |
| 6,889,037 | B2 * | 5/2005 | Darabl | 455/323 |
| 7,016,664 | B2 | 3/2006 | Souetinov | |
| 7,046,068 | B2 | 5/2006 | Chiu et al. | |
| 7,088,981 | B2 | 8/2006 | Chang | |
| 7,177,620 | B1 * | 2/2007 | Tsai et al. | 455/333 |
| 7,546,109 | B2 * | 6/2009 | Reynolds | 455/323 |
| 2004/0063419 | A1 | 4/2004 | Molnar et al. | |
| 2005/0124311 | A1 * | 6/2005 | Mahmoudi et al. | 455/323 |

FOREIGN PATENT DOCUMENTS

FR    2827097    1/2003

OTHER PUBLICATIONS

EP Search Report mailed Aug. 18, 2008.
"Low 1 / f Noise CMOS Active Mixers for Direct Conversion" Manstretta et al., IEEE Transactions on Circuits and Systems, vol. 48, No. 9, Sep. 2001, pp. 846-850.
"Noise in RF-CMOS Mixers: A Simple Physical Model" Darabi et al., IEEE Transactions on Solid State Circuits, vol. 35, No. 1, Jan. 2000, pp. 15-25.

* cited by examiner

*Primary Examiner*—Simon D Nguyen
(74) *Attorney, Agent, or Firm*—Thomas, Kayden, Horstemeyer & Risley

(57) ABSTRACT

A dynamic current steering mixer. The dynamic current steering mixer comprises a Gilbert cell mixer core, a pair of load devices, a dynamic current steering cell, and a transconductor cell. The Gilbert cell mixer core has first and second nodes, receives a first differential input signal, and provides a differential output signal at the first nodes thereof. The load devices are respectively coupled between the first nodes of the Gilbert cell mixer core and a first fixed voltage. The dynamic current steering cell has third nodes coupled to the second nodes and fourth nodes. The transconductor cell is coupled between the fourth nodes and a second fixed voltage and receives a second differential input signal. The dynamic current steering cell alternately steers current of the transconductor cell to or away from the Gilbert cell mixer core.

23 Claims, 17 Drawing Sheets

DYNAMIC CURRENT STEERING MIXER

BACKGROUND OF THE INVENTION

1. Field of the Invention

The invention relates to a double-balanced mixer and, in particular, to a double-balance mixer with a dynamic current steering cell.

2. Description of the Related Art

Mixer circuits for high frequency applications constructed using metal oxide semiconductor (MOS) transistors are subject to a limited voltage supply (usually less than 2V) and high levels of flicker noise, having frequencies extending to several tens of MHz. Accordingly, the gain and output signal level required in such mixer circuits exceed those required in the equivalent bipolar circuits.

FIG. 1 is a circuit diagram illustrating a conventional double balanced mixer circuit. The double balanced mixer circuit in FIG. 1 includes differential pairs of MOSFETs (Q131-Q132 and Q133-Q134). The drains of the pairs of MOSFETs are connected to an output terminal (Output-I+ and Output-I−). The gates of the pairs of MOSFETs are connected to first input terminals (Input-II+ and Input-II−). The double balanced mixer circuit in FIG. 1 also includes active devices Q135, Q136, Q137 and Q138. The sources of the MOSFET pair Q131-Q132 are connected to the drains of the active devices Q135 and Q136. The sources of the MOSFET pair Q133-Q134 are connected to the drains of the active devices Q137 and Q138. The gates of the active devices Q135, Q136, Q137 and Q138 are connected to the second input terminal (Input-I+ and Input-I−). The sources of the active devices Q135, Q136, Q137 and Q138 are connected to the ground through an impedance unit (Degeneration Impedance).

FIG. 2 is a circuit diagram of a conventional quadrature mixer disclosed by Raj a S Pullela et. al in ISSCC 2006. The conventional quadrature mixer 200 comprises an I-Mixer Quad 210, a Q-Mixer Quad 220, a 2x LO stage 230, and a transconductor stage 240. The I-Mixer Quad 210 in FIG. 2 includes differential pairs of MOSFETs (M9-M10 and M11-M12). The drains of the pairs of MOSFETs are connected to an output terminal (BBIp and BBIn). The gates of the pairs of MOSFETs are connected to first input terminals (LOIp and LOIn). The Q-Mixer Quad 220 in FIG. 2 includes differential pairs of MOSFETs (M13-M14 and M15-M16). The drains of the pairs of MOSFETs are connected to an output terminal (BBQp and BBQn). The gates of the pairs of MOSFETs are connected to first input terminals (LOQp and LOQn). The 2x LO stage 230 comprises MOSFETs M5, M6, M7 and M8. Sources of the MOSFETs M9-M10 and M11-M12 are respectively connected to drains of the MOSFETs M5 and M7 and those of the MOSFETs M13-M14 and M15-M16 respectively connected to drains of the MOSFETs M6 and M8. Gates of the MOSFETs M5 and M7 are connected to an input terminal 2Lop and those of the MOSFETs M6 and M8 connected to an input terminal 2Lon. MOSFETs M1 and M3 are connected between the sources of the MOSFETs M5-M6 and a ground GND and MOSFETs M2 and M4 connected between the sources of the MOSFETs M7-M8 and the ground. Gates of the MOSFETs M1 and M3 are connected to an input terminal RF+ and those of the MOSFETs M2 and M4 connected to an input terminal RF−.

BRIEF SUMMARY OF THE INVENTION

An embodiment of a dynamic current steering mixer comprises a Gilbert cell mixer core, a pair of load devices, a dynamic current steering cell, and a transconductor cell. The Gilbert cell mixer core has first and second nodes, receives a first differential input signal, and provides a differential output signal at the first nodes thereof. The load devices are respectively coupled between the first nodes of the Gilbert cell mixer core and a first fixed voltage. The dynamic current steering cell has third nodes coupled to the second nodes and fourth nodes. The transconductor cell is coupled between the fourth nodes and a second fixed voltage and receives a second differential input signal. The dynamic current steering cell alternately steers current of the transconductor cell to or away from the Gilbert cell mixer core.

An embodiment of a quadrature dynamic current steering mixer comprises first and second dynamic current steering mixers connected in parallel between first and second fixed voltages. Each of the first and second dynamic current steering mixers comprises a Gilbert cell mixer core, a pair of load devices, a dynamic current steering cell, and a transconductor cell. The Gilbert cell mixer core has first and second nodes, receives a first differential input signal, and provides a differential output signal at the first nodes thereof. The load devices are respectively coupled between the first nodes of the Gilbert cell mixer core and the first fixed voltage. The dynamic current steering cell has third nodes coupled to the second nodes and fourth nodes. The transconductor cell is coupled between the fourth nodes and the second fixed voltage and receives a second differential input signal. The dynamic current steering cell alternately steers current of the transconductor cell to or away from the Gilbert cell mixer core. There is a phase difference of 90° between the first differential input signals of the first and second dynamic current steering mixers.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
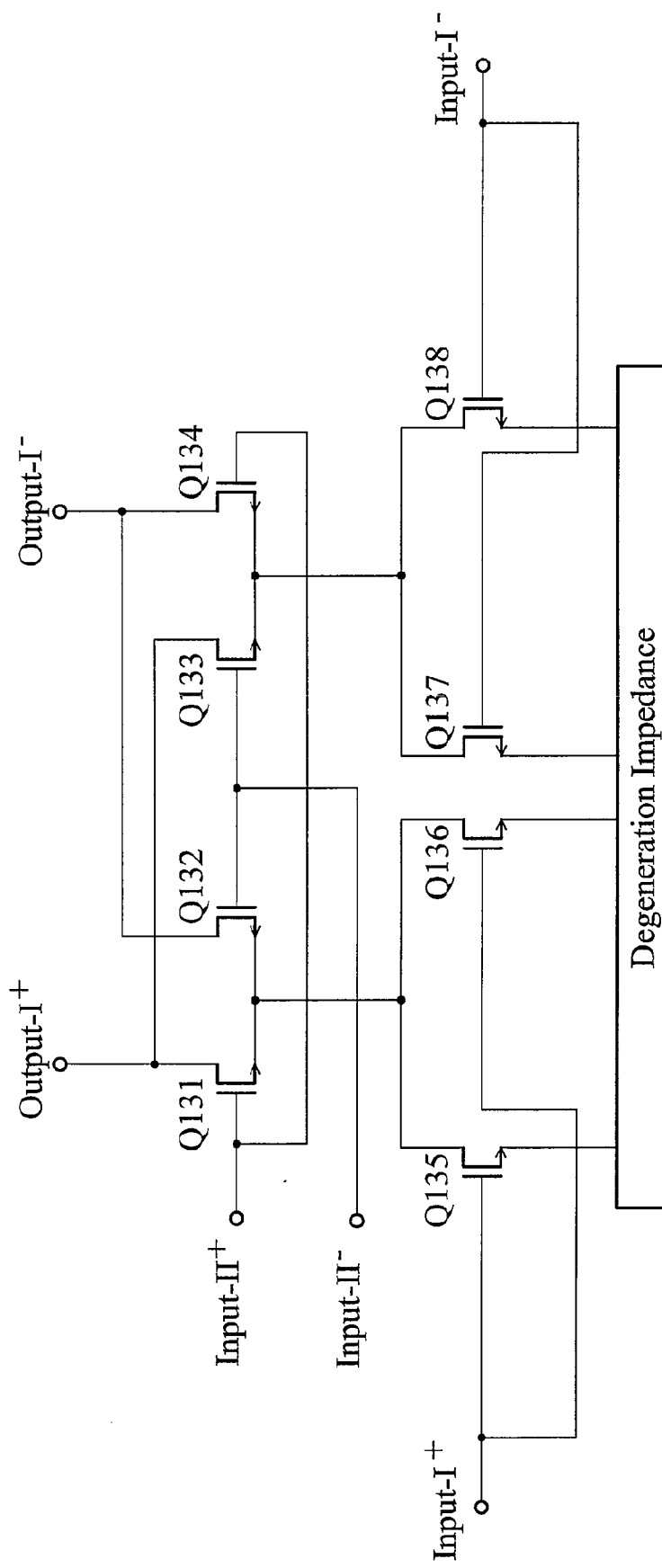
FIG. 1 is a circuit diagram illustrating a conventional double balanced mixer circuit.
Figure 2:
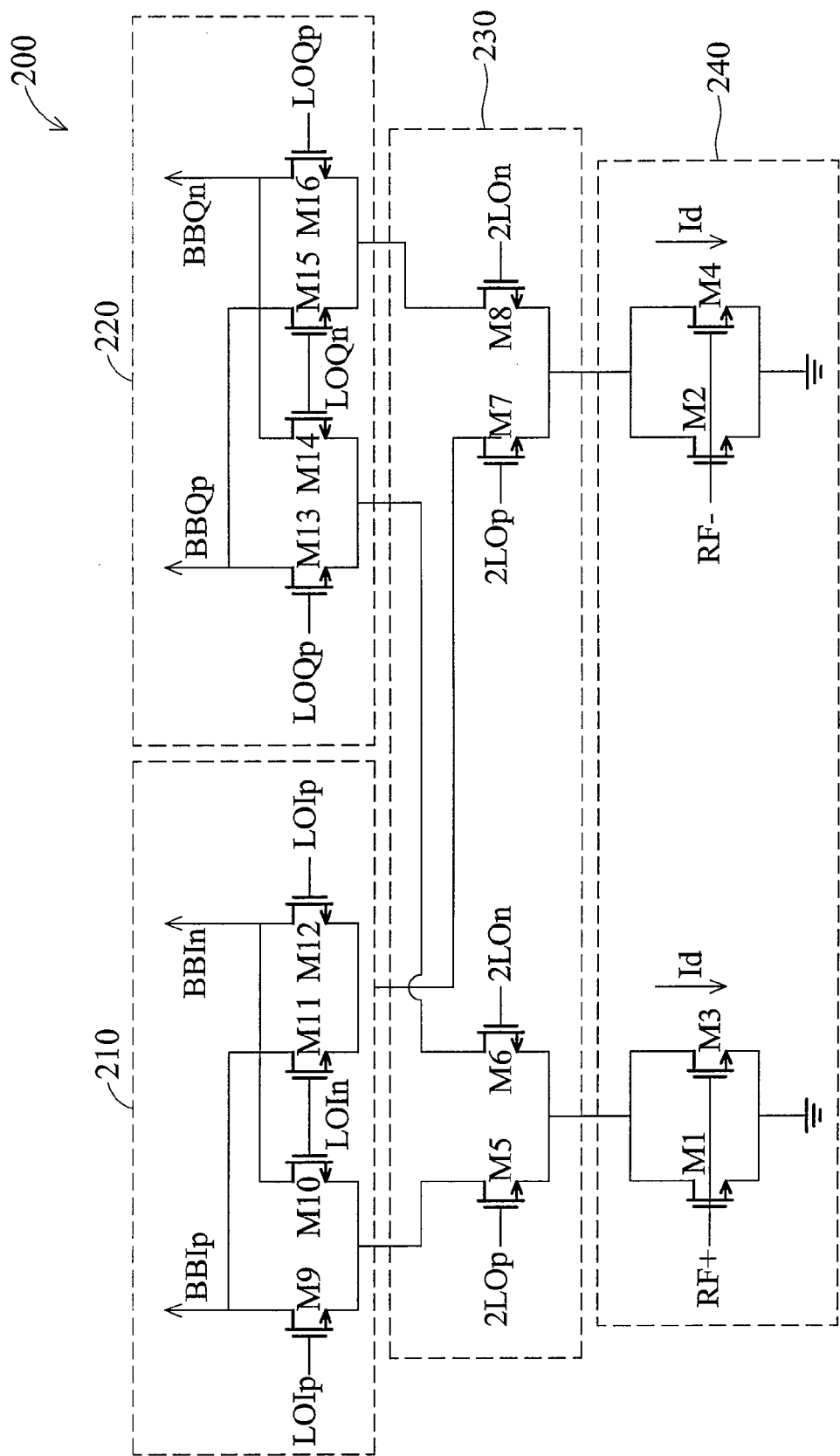
FIG. 2 is a circuit diagram of a conventional quadrature mixer disclosed by Raja S Pullela et. al in ISSCC 2006.
Figure 3:
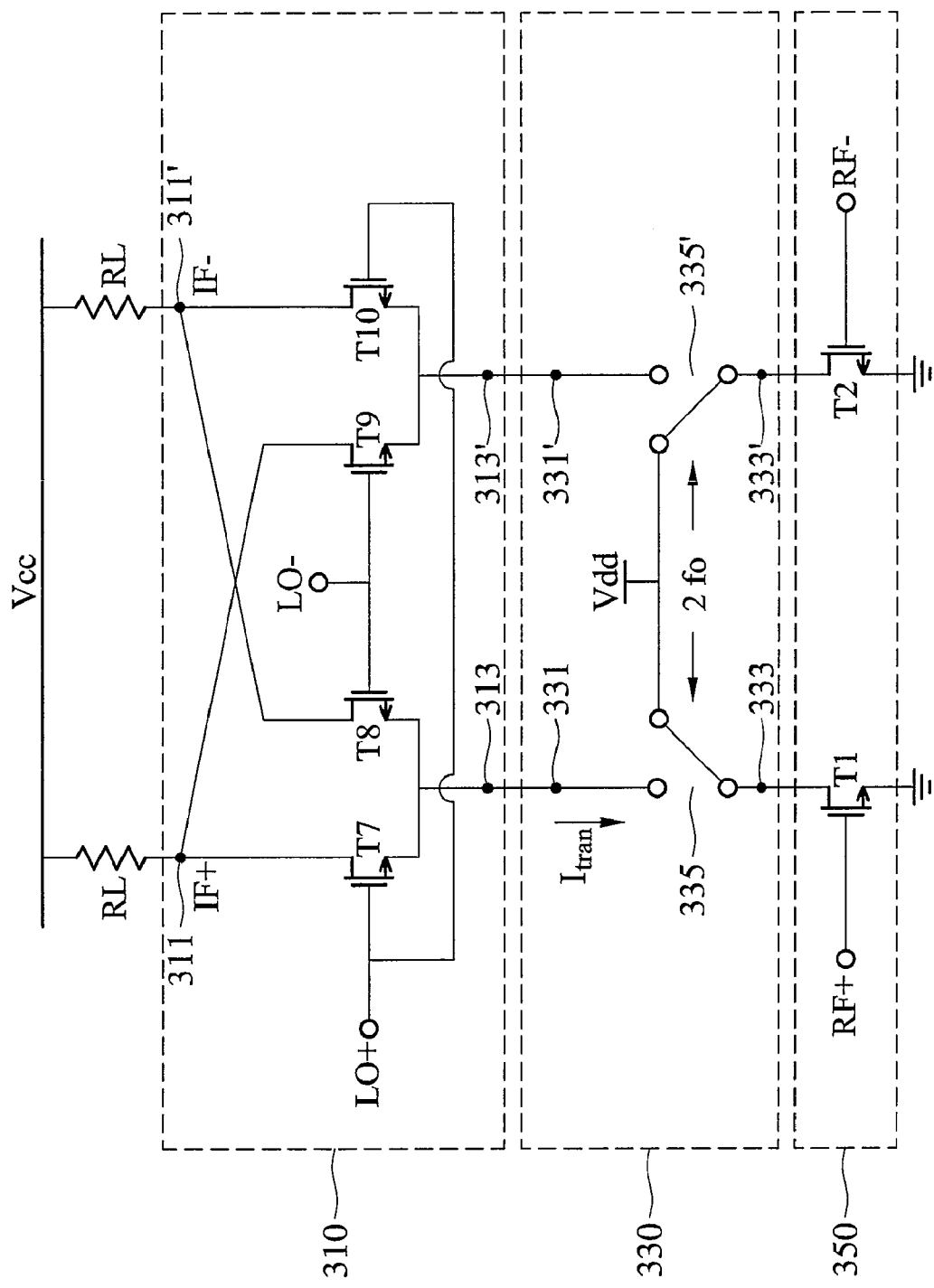
FIG. 3 is a circuit diagram of a dynamic current steering mixer according to an embodiment of the invention.

FIG. 3 is a circuit diagram of a dynamic current steering mixer according to an embodiment of the invention. The dynamic current steering mixer 300 comprises a Gilbert cell mixer core 310, a pair of load devices RL, a dynamic current steering cell 330, and a transconductor cell 350. The Gilbert cell mixer core 310 has first nodes 311 and 311' and second nodes 313 and 313' and comprises differential pairs of NMOS transistors T7-T8 and T9-T10 coupled therebetween. The Gilbert cell mixer core 310 receives a local oscillator signal LO+/LO−, and provides an intermediate frequency (IF) signal IF+/IF− at the first nodes 311 and 311'. The load devices RL are respectively coupled between the first nodes 311 and 311' of the Gilbert cell mixer core 310 and a supply voltage Vcc. The dynamic current steering cell 330 has third nodes 331 and 331' respectively coupled to the second nodes 313 and 313', and fourth nodes 333 and 333'. The dynamic current steering cell 330 comprises a first switch 335 and a second switch 335'. The first and second switches 335 and 335' alternately connect to the fourth nodes 333 and 333', the third node 331 and 331', and a fixed voltage Vdd according to a control signal 2fo, respectively. Frequency of the control signal is twice of that of the local oscillator signal LO+/LO−. The transconductor cell 350 comprises NMOS transistors T1 and T2 coupled between the fourth nodes 333 and 333' and a ground GND. Gates of the NMOS transistors T1 and T2 receive a radio frequency (RF) signal RF+/RF−.

Figure 4B:
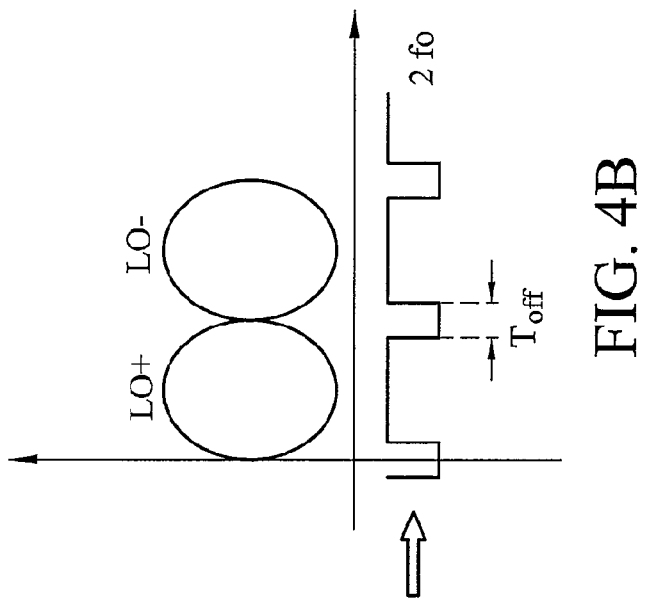
FIG. 4B is a schematic diagram showing waveforms of the local oscillator signal LO+/LO− and the control signal $2f_o$ in FIG. 4A.
Figure 4A:
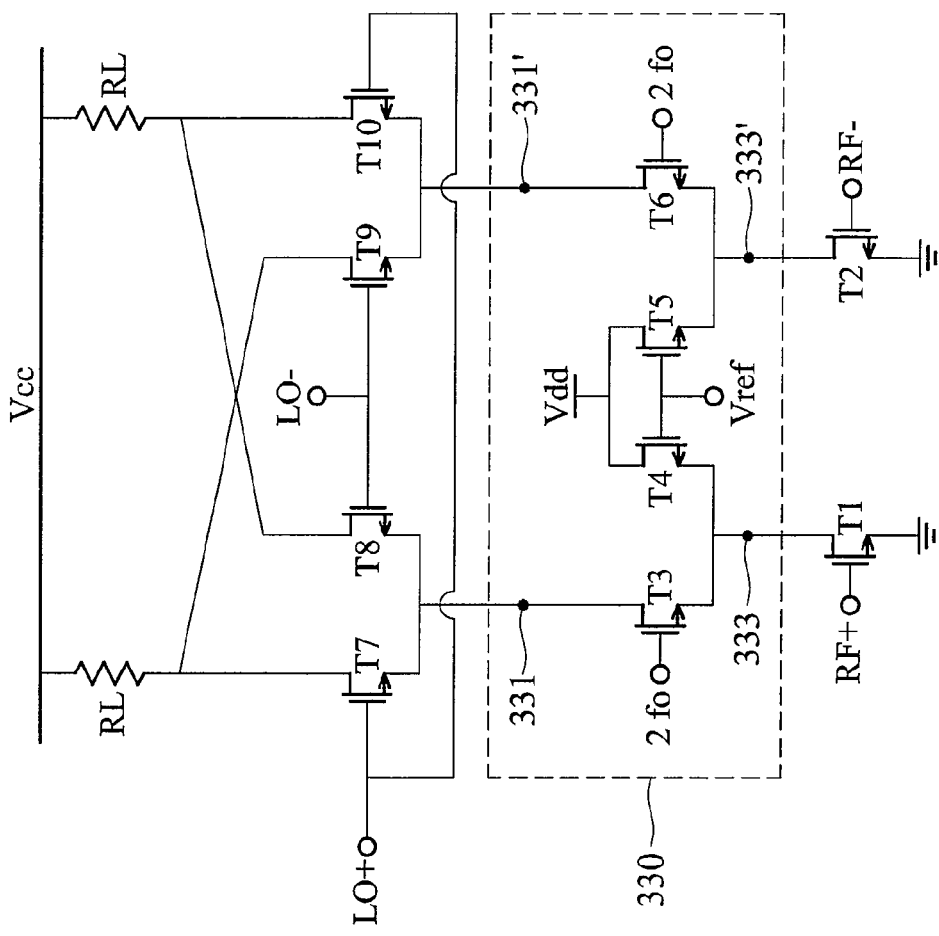
FIG. 4A is a detailed circuit diagram of the dynamic current steering mixer in FIG. 3.

FIG. 4A is a detailed circuit diagram of the dynamic current steering mixer in FIG. 3. In FIG. 4A, the dynamic current steering cell 330 comprises NMOS transistors T3, T4, T5 and T6. The NMOS transistors T3 and T6 are coupled between the third nodes 331 and 331' and the fourth nodes 333 and 333'. The NMOS transistors T4 and T5 are coupled between the fixed voltage Vdd and the fourth nodes 333 and 333'. Gates of the NMOS transistors T3 and T6 receive the control signal 2fo and those of the NMOS transistors T4 and T5 are connected to a reference voltage Vref. Preferably, the fixed voltage Vdd is the same as the supply voltage Vcc. FIG. 4B is a schematic diagram showing waveforms of the local oscillator signal LO+/LO− and the control signal 2fo in FIG. 4A. At zero-crossing points Toff of the local oscillator signal LO+/LO−, voltage level of the control signal 2fo is lower than the reference voltage Vref, allowing the NMOS transistors T3 and T6 to be turned off. Current (both DC and AC) of the transconductor cell 350 is thus steered to the NMOS transistors T4 and T5. Since voltage level of the control signal 2fo exceeds the reference voltage Vref at non-zero-crossing points of the local oscillator signal LO+/LO−, the NMOS transistors T3 and T6 will be turned on. Current (both DC and AC) of the transconductor cell 350 is thus steered to the NMOS transistors T3 and T6. It is well-known that flicker noise of the Gilbert cell mixer core 310 is proportional to a current injected therein at zero-crossing point. Therefore, steering current off the Gilbert cell mixer core 310 according to the dynamic current steering cell of the present invention can successfully suppress the flicker noise and would be insensitive to LO quality.

Figure 4C:
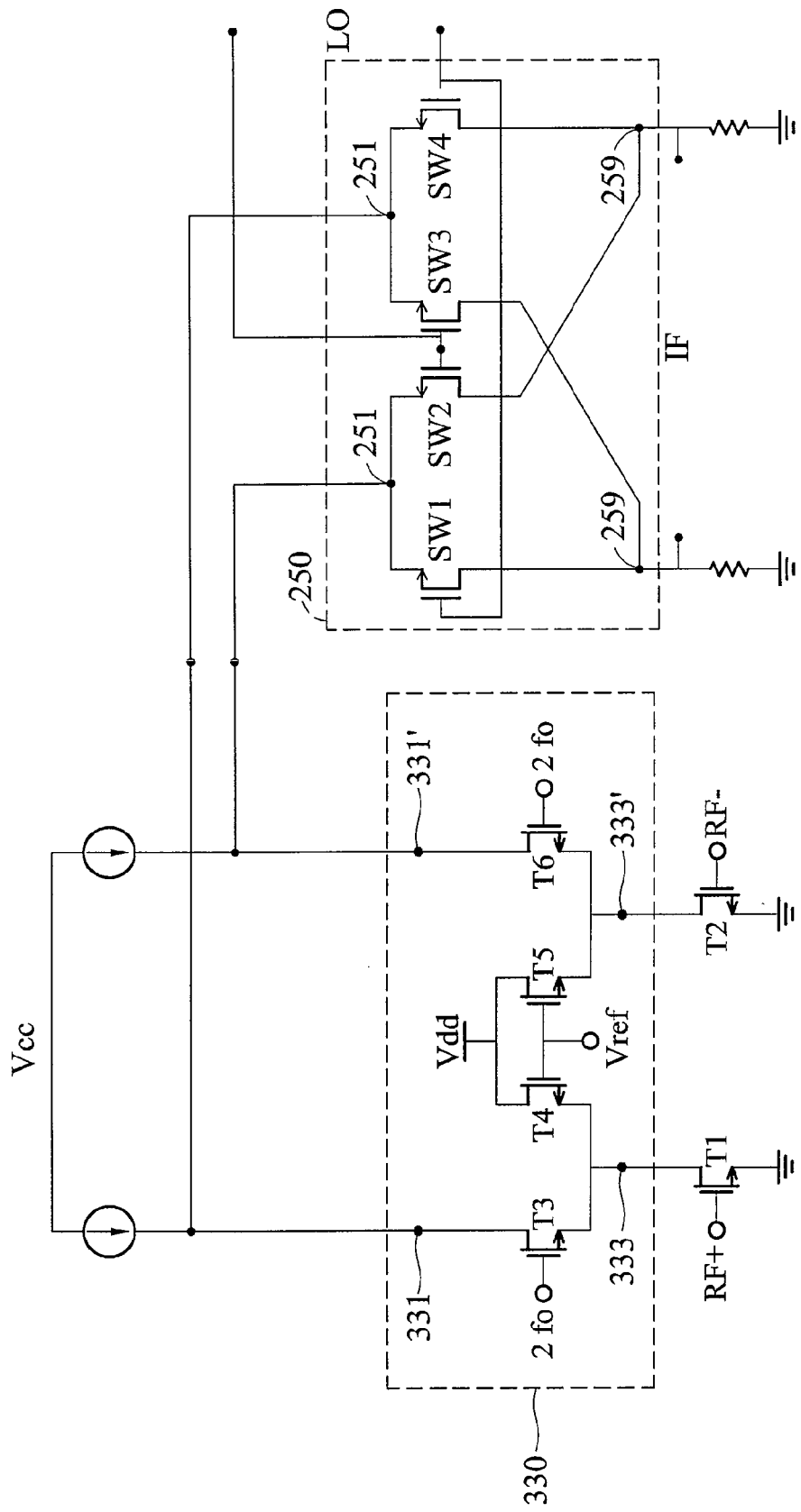
FIG. 4C is a detailed diagram of a variant of the dynamic current steering mixer in FIG. 4A.

FIG. 4C shows another embodiment of the dynamic current steering mixer of the present invention. The main difference between the dynamic current steering mixer in FIG. 4A and in FIG. 4C is that the Gilbert cell mixer core 310 and the load devices are folded down and coupled to the ground GND. The NMOS transistors T7, T8, T9 and T10 in the Gilbert cell mixer core 310 are replaced by PMOS transistors.

Figure 4D:
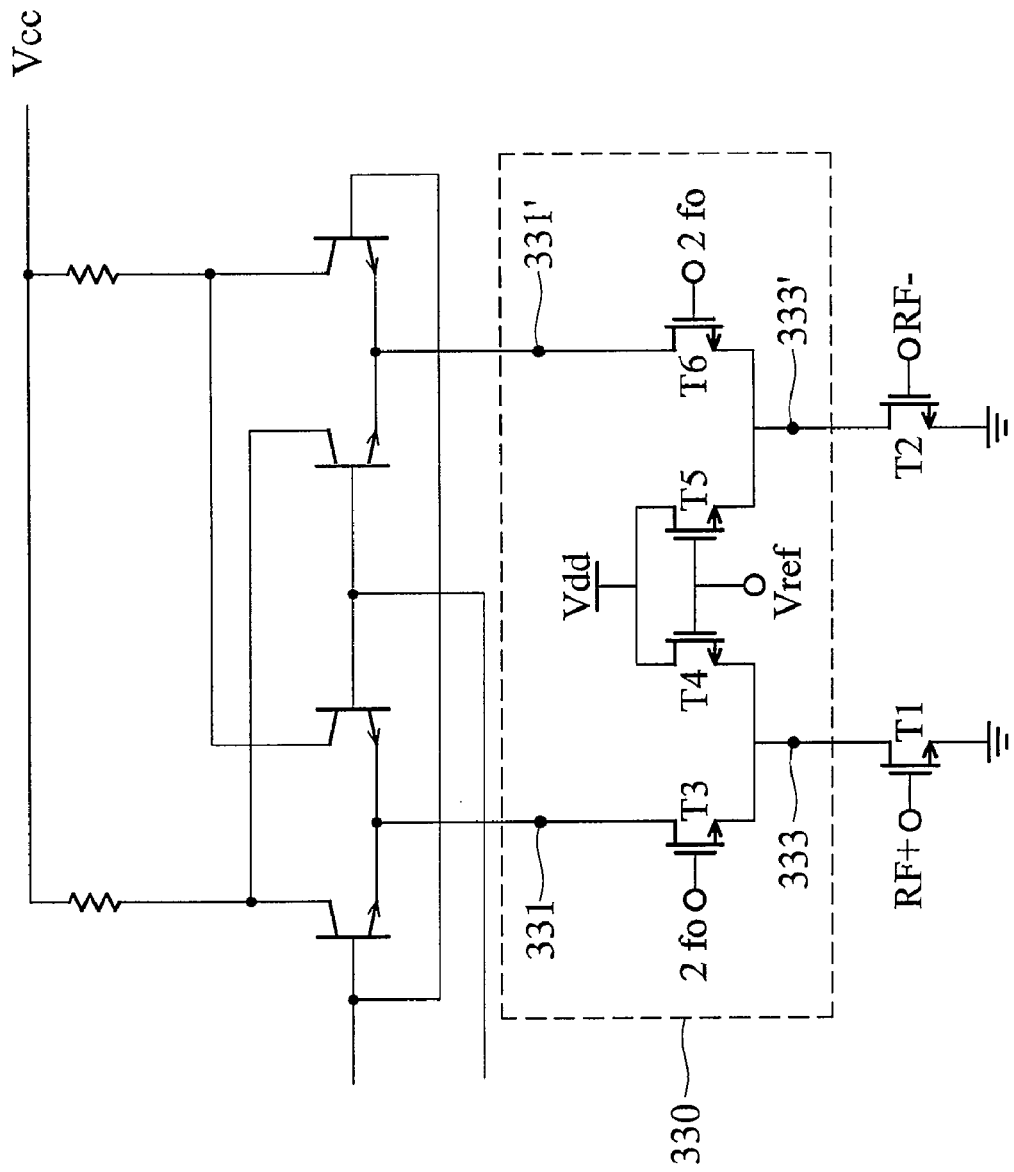
FIG. 4D is a detailed diagram of another variant of the dynamic current steering mixer in FIG. 4A.

FIG. 4D shows another embodiment of the dynamic current steering mixer of the present invention. The main difference between the dynamic current steering mixer in FIG. 4A and in FIG. 4D is that the NMOS transistors T7, T8, T9 and T10 in the Gilbert cell mixer core 310 are replaced by bipolar junction transistors (BJTs). It is noted that the Gilbert cell mixer core 310 and the load devices in FIG. 4D can also be folded down and coupled to the ground GND. In addition, the dynamic current steering cell comprising the NMOS transistors T3, T4, T5, and T6 is an embodiment and the scope is not limited thereto. Bipolar junction transistors are also applicable to the dynamic current steering cell.

Figure 5B:
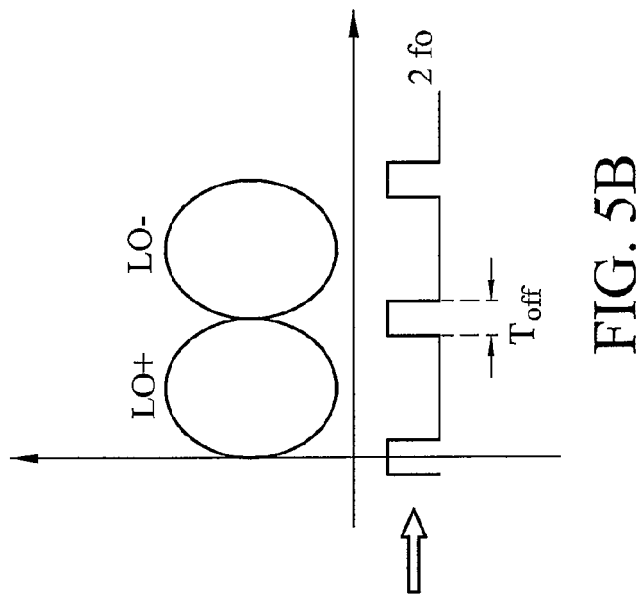
FIG. 5B is a schematic diagram showing waveforms of the local oscillator signal LO+/LO− and the control signal $2f_o$ in FIG. 5A.
Figure 5A:
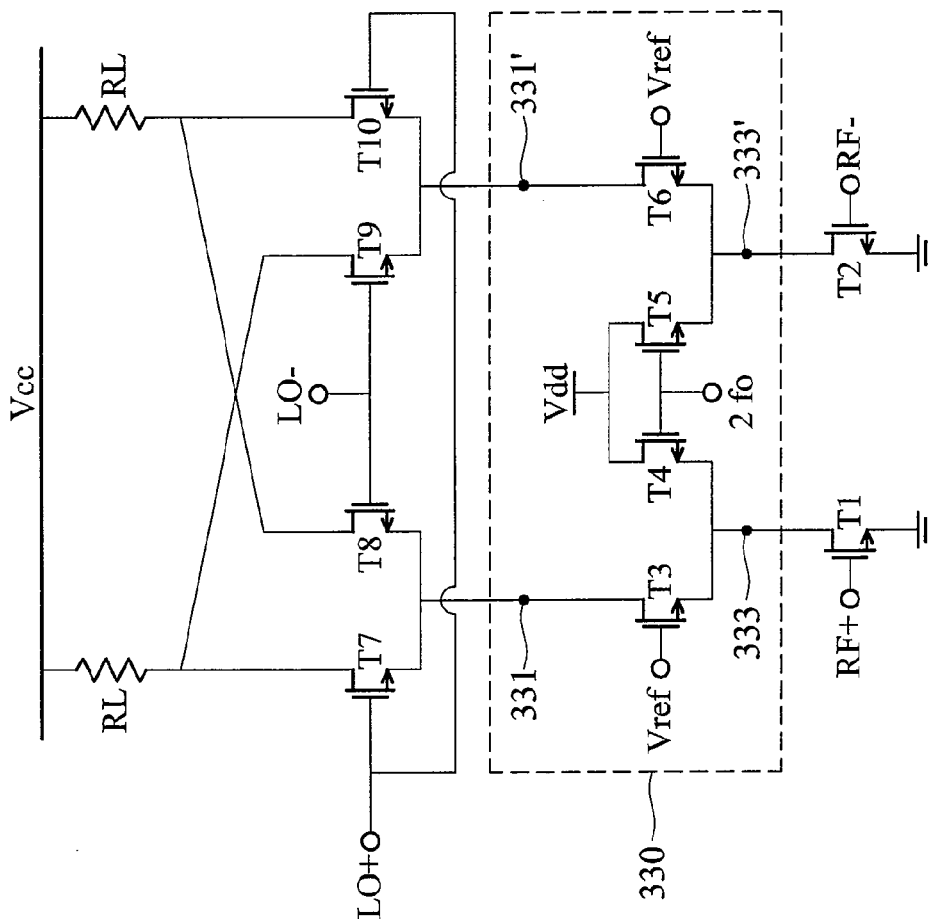
FIG. 5A is a detailed circuit diagram of the dynamic current steering mixer in FIG. 3.

FIG. 5A is a detailed circuit diagram of the dynamic current steering mixer in FIG. 3. In FIG. 5A, the dynamic current steering cell 330 comprises NMOS transistors T3, T4, T5 and T6. The NMOS transistors T3 and T6 are coupled between the third nodes 331 and 331' and the fourth nodes 333 and 333'. The NMOS transistors T4 and T5 are coupled between the fixed voltage Vdd and the fourth nodes 333 and 333'. Gates of the NMOS transistors T3 and T6 are connected to a reference voltage Vref and those of the NMOS transistors T4 and T5 receive the control signal 2fo. Preferably, the fixed voltage Vdd is the same as the supply voltage Vcc. FIG. 5B is a schematic diagram showing waveforms of the local oscillator signal LO+/LO− and the control signal 2fo in FIG. 5A. At zero-crossing points Toff of the local oscillator signal LO+/LO−, voltage level of the control signal 2fo exceeds the reference voltage Vref, allowing the NMOS transistors T3 and T6 to be turned off. Current (both DC and AC) of the transconductor cell 350 is thus steered to the NMOS transistors T4 and T5. Since voltage level of the control signal 2fo is lower than the reference voltage Vref at non-zero-crossing points of the local oscillator signal LO+/LO−, the NMOS transistors T3 and T6 are then turned on. Current (both DC and AC) of the transconductor cell 350 is thus steered to the NMOS transistors T3 and T6. As a result, current of the transconductor cell 350 is steered off the Gilbert cell mixer core 310 at zero-crossing points Toff of the local oscillator signal LO+/LO− and flicker noise thereof is thus suppressed.

Figure 5C:
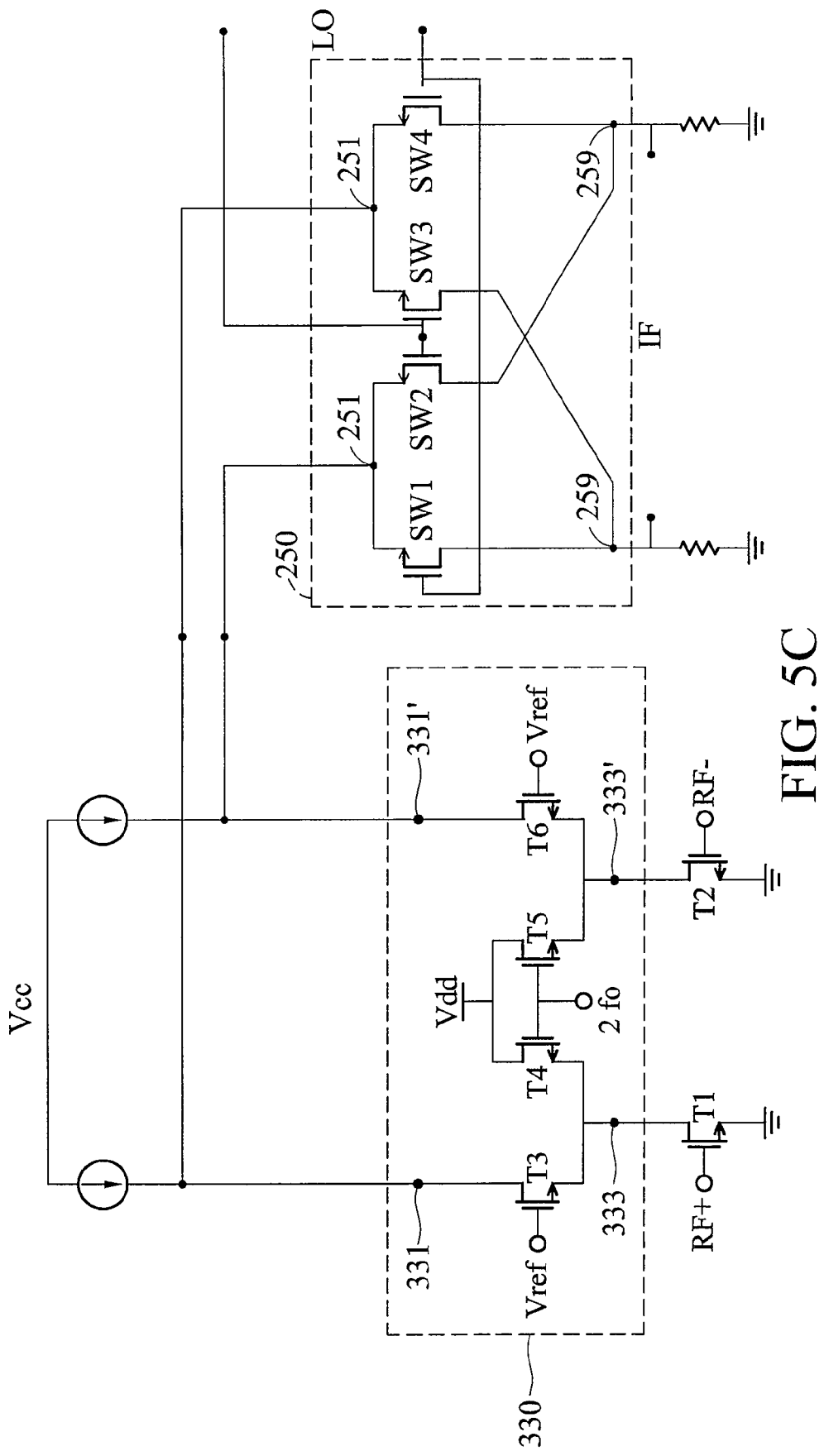
FIG. 5C is a detailed diagram of a variant of the dynamic current steering mixer in FIG. 5A.

FIG. 5C shows another embodiment of the dynamic current steering mixer of the present invention. The main difference between the dynamic current steering mixer in FIG. 5A and in FIG. 5C is that the Gilbert cell mixer core 310 and the load devices are folded down and coupled to the ground GND. The NMOS transistors T7, T8, T9 and T10 in the Gilbert cell mixer core 310 are replaced by PMOS transistors.

Figure 5D:
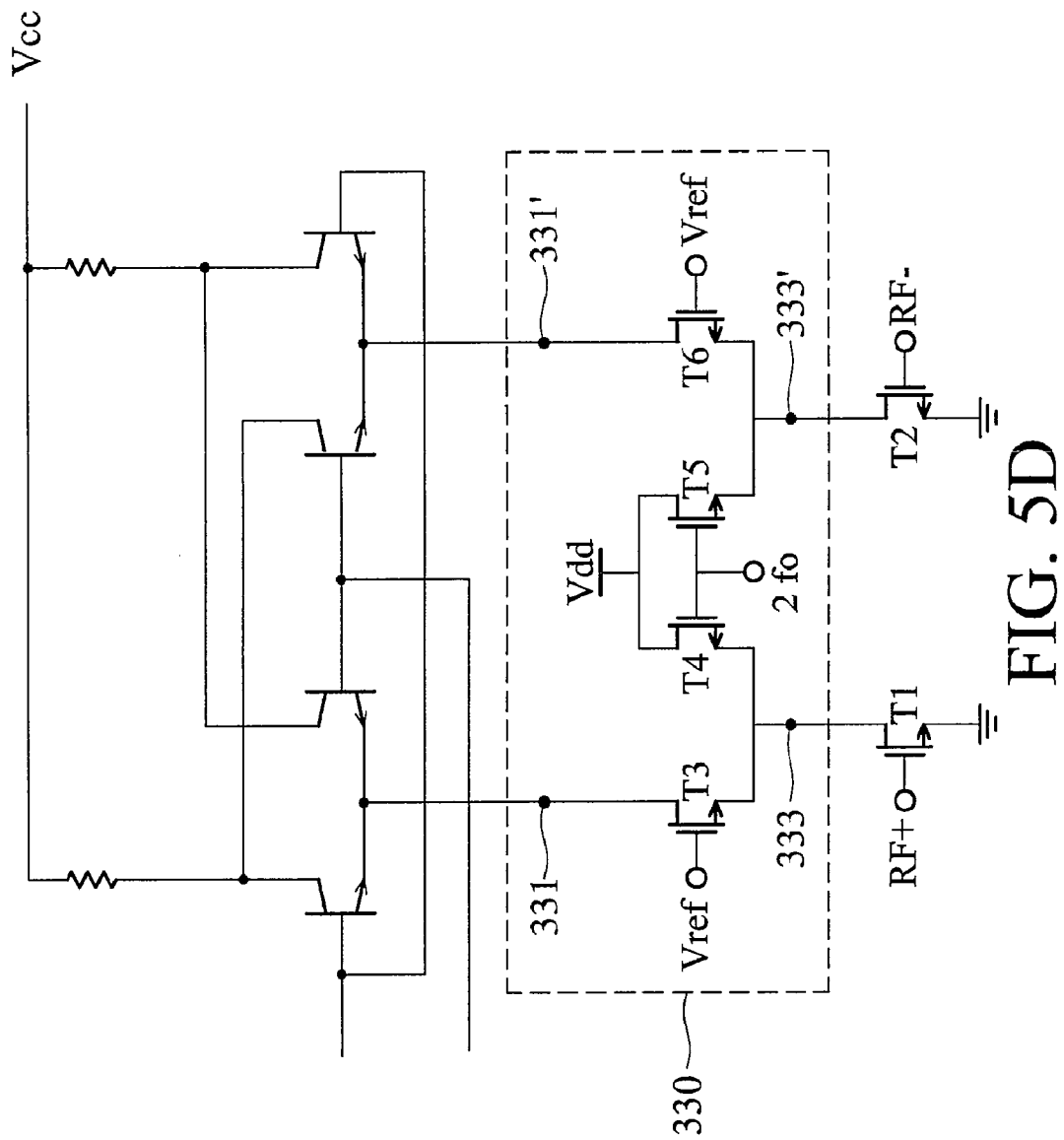
FIG. 5D is a detailed diagram of another variant of the dynamic current steering mixer in FIG. 5A.

FIG. 5D shows another embodiment of the dynamic current steering mixer of the present invention. The main difference between the dynamic current steering mixer in FIG. 5A and in FIG. 5D is that the NMOS transistors T7, T8, T9 and T10 in the Gilbert cell mixer core 310 are replaced by bipolar junction transistors (BJTs). It is noted that the Gilbert cell mixer core 310 and the load devices in FIG. 5D can also be folded down and coupled to the ground GND. In addition, the dynamic current steering cell comprising the NMOS transistors T3, T4, T5, and T6 is an embodiment and the scope is not limited thereto. Bipolar junction transistors are also applicable to the dynamic current steering cell.

Figure 6A:
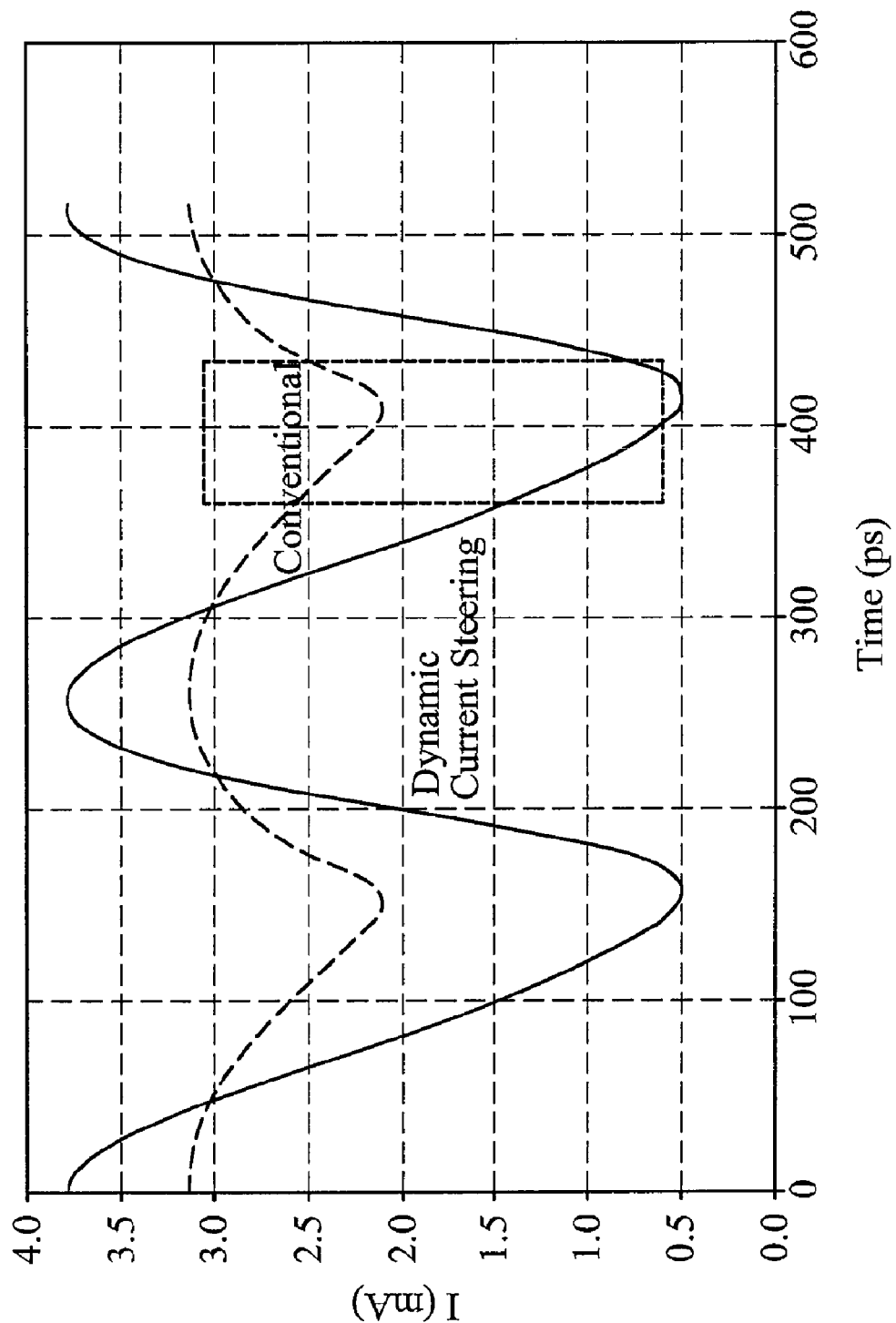
FIG. 6A is a schematic diagram of current of a Gilbert cell mixer core in a conventional double balanced mixer and a dynamic current steering mixer according to an embodiment of the invention.
Figure 6B:
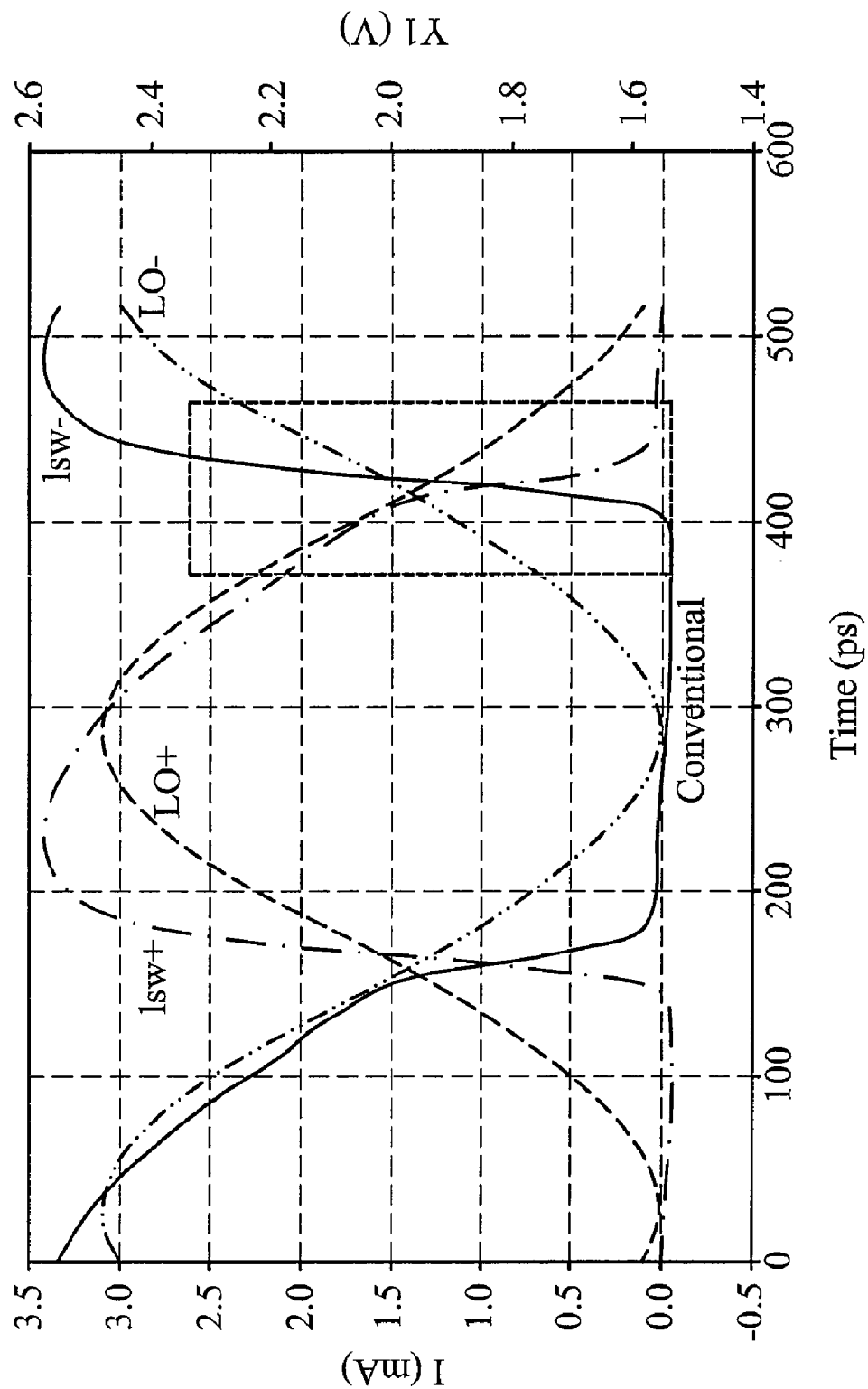
FIGS. 6B and 6C are respectively schematic diagrams of current of the NMOS transistors in a Gilbert cell mixer core of a conventional double balanced mixer and a dynamic current steering mixer according to an embodiment of the invention.
Figure 6C:
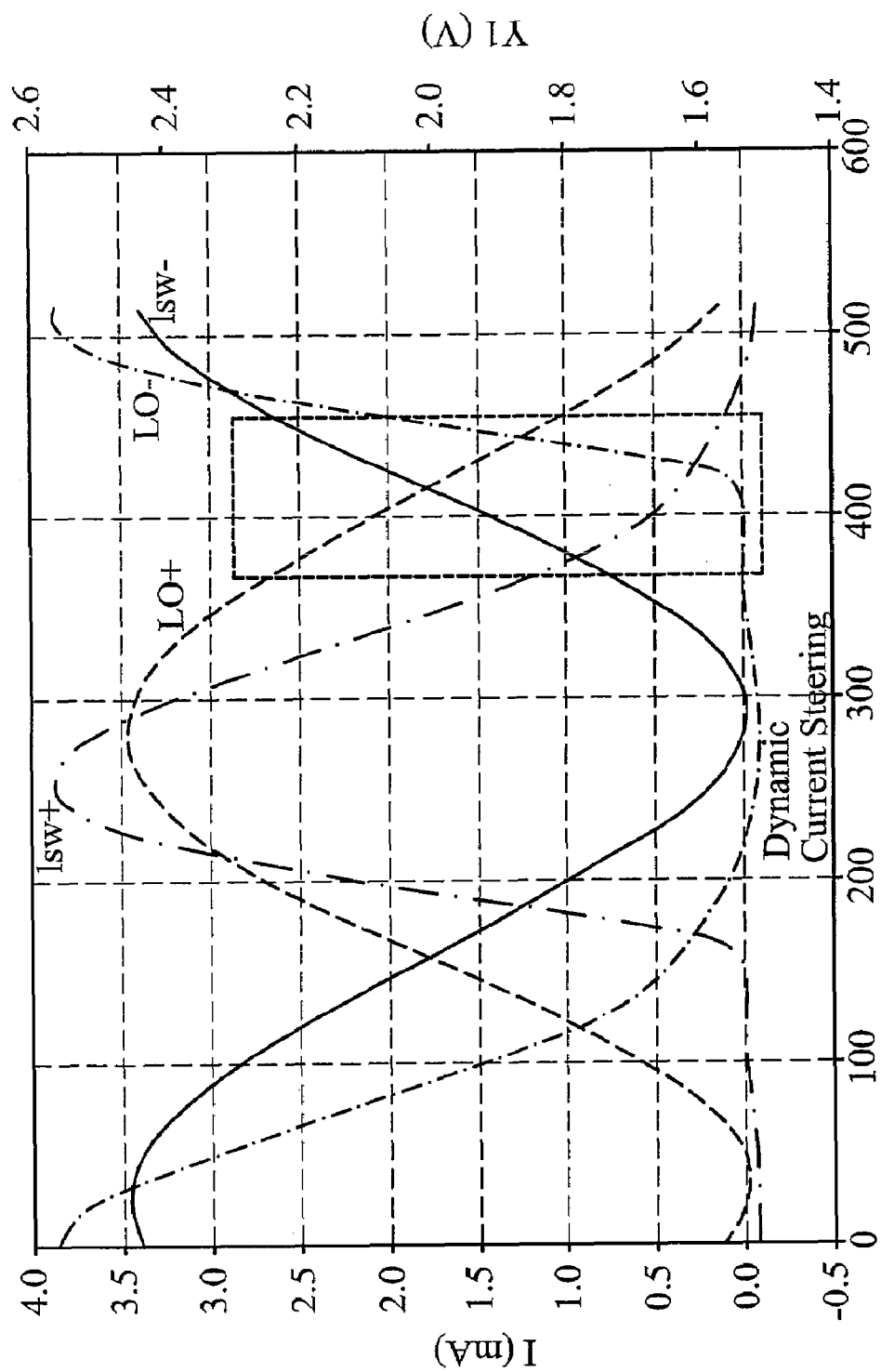
Figure 6D:
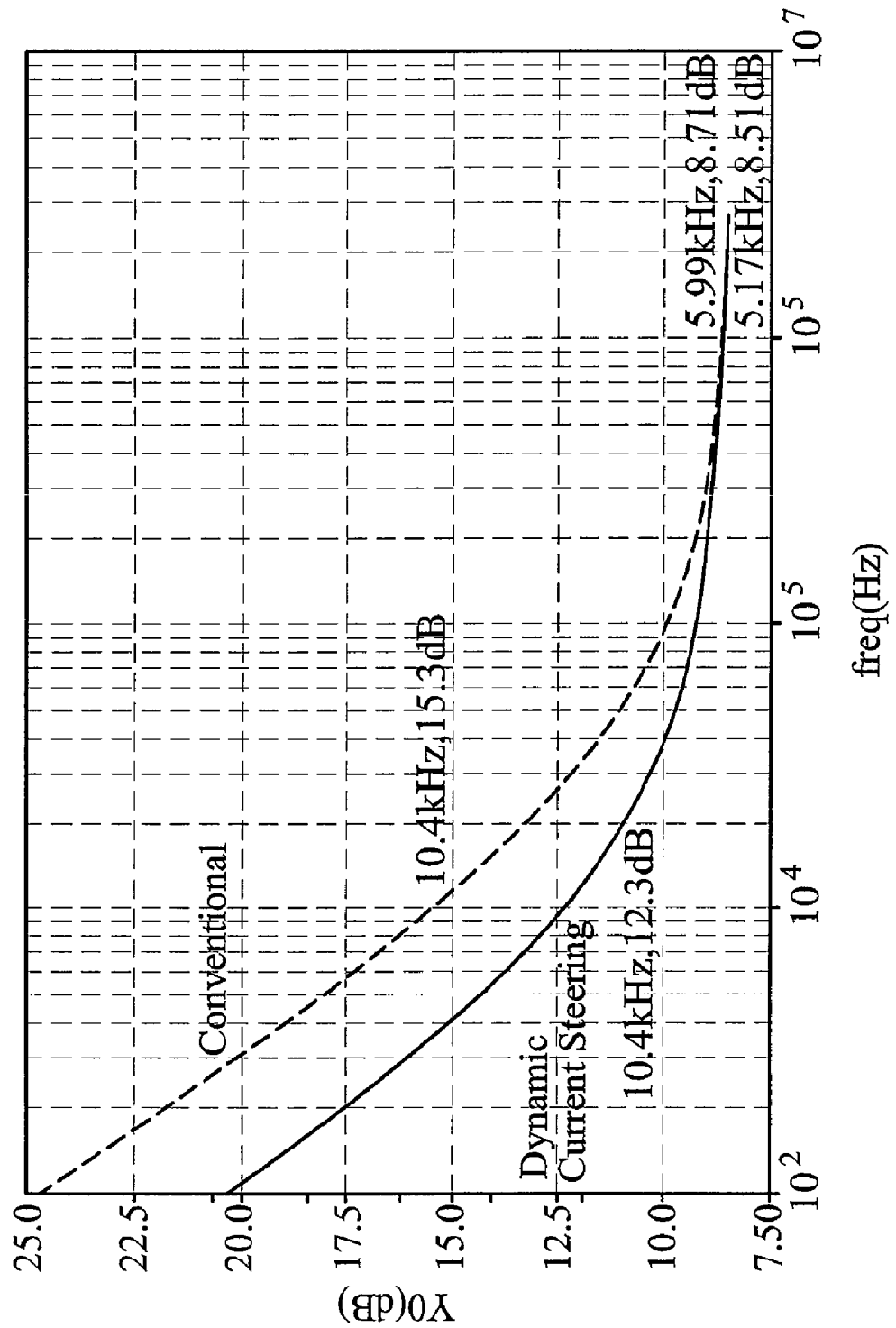
FIG. 6D is a schematic diagram showing noise figure of a conventional double balanced mixer and a dynamic current steering mixer according to an embodiment of the invention.

FIG. 6A is a schematic diagram of current of a Gilbert cell mixer core in a conventional double balanced mixer and a dynamic current steering mixer according to an embodiment of the invention. In FIG. 6A, current of the Gilbert cell mixer core in a conventional double balanced mixer exceeds that of a dynamic current steering mixer according to an embodiment of the invention at zero-crossing points (represented by a dashed-line box). FIGS. 6B and 6C are respectively schematic diagrams of current of the NMOS transistors in a Gilbert cell mixer core of a conventional double balanced mixer and a dynamic current steering mixer according to an embodiment of the invention. In FIG. 6B, current of the NMOS transistors in a Gilbert cell mixer core of a conventional double balanced mixer is about 1 mA. In FIG. 6C, current of the NMOS transistors in a Gilbert cell mixer core of a dynamic current steering mixer according to an embodiment of the invention is only about 0.3 mA. FIG. 6D shows noise figure of a conventional double balanced mixer and a dynamic current steering mixer according to an embodiment of the invention. In FIG. 6D, noise figure of a conventional double balanced mixer is 15.3 dB at 10.4 kHz and that of a dynamic current steering mixer according to an embodiment of the invention is only 12.3 dB at 10.4 kHz.

Figure 7A:
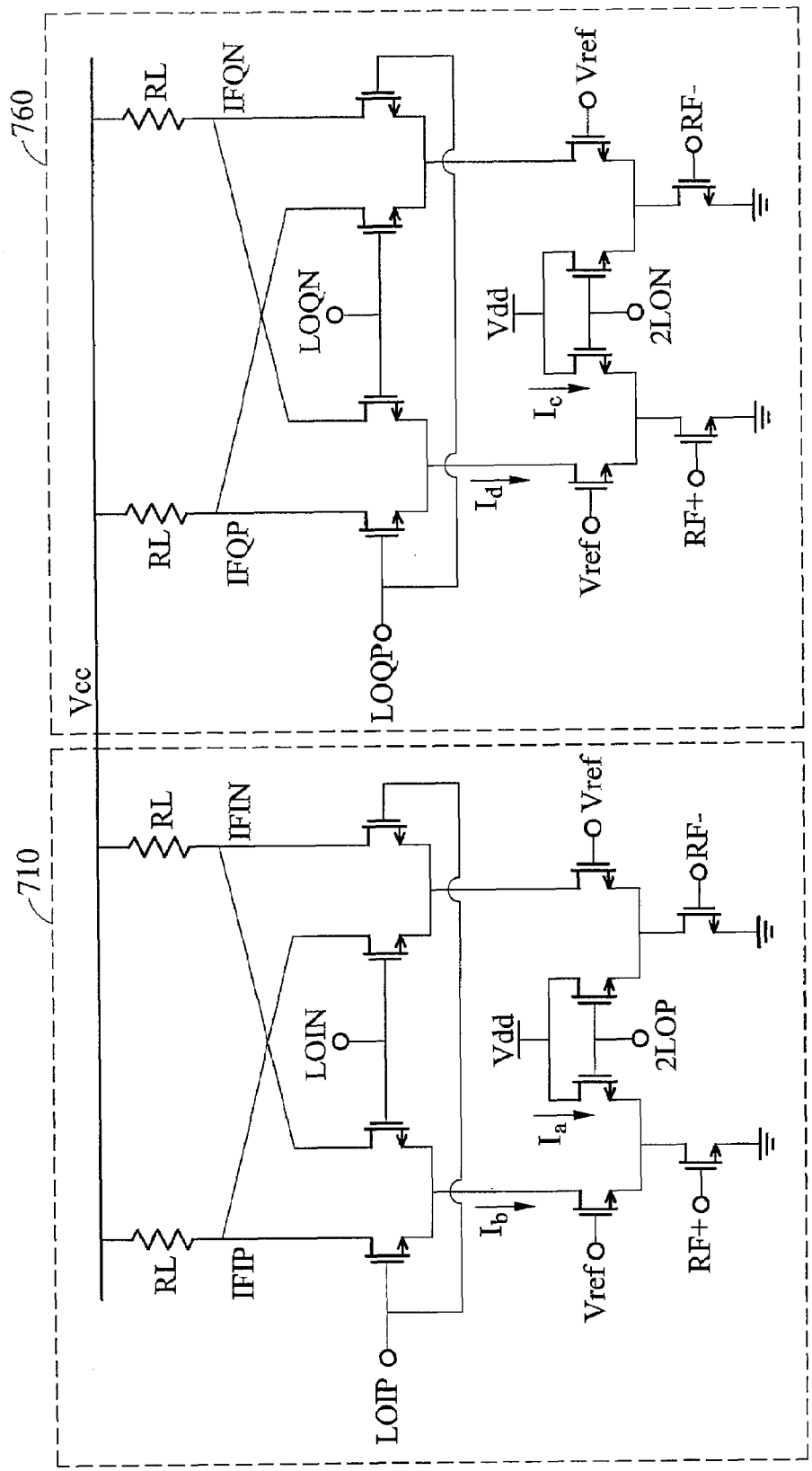
FIG. 7A is a circuit diagram of a quadrature dynamic current steering mixer according to an embodiment of the invention.

FIG. 7A is a circuit diagram of a quadrature dynamic current steering mixer according to an embodiment of the invention. In FIG. 7A, the quadrature dynamic current steering mixer 700 comprises an I-Quad mixer 710 and a Q-Quad mixer 760. The I-Quad mixer 710 and the Q-Quad mixer 760 are both dynamic current steering mixers as disclosed in FIG. 5A and connected in parallel between a supply voltage Vcc and a ground GND. The Gilbert mixer core 310 in the I-Quad mixer 710 receives a local oscillator signal LOIP/LOIN and that in the Q-Quad mixer 760 a local oscillator signal LOQP/LOQN. The dynamic current steering cell 330 in the I-Quad mixer 710 is controlled by a control signal 2LOP and that in the Q-Quad mixer 760 controlled by a control signal 2LON. The I-Quad mixer 710 generates an IF signal IFIP/IFIN and the Q-Quad mixer 760 an IF signal IFQP/IFQN. Since the I-Quad mixer 710 and the Q-Quad mixer 760 in the quadrature dynamic current steering mixer 700 are both dynamic current steering mixers, noise figure of the quadrature dynamic current steering mixer 700 according to an embodiment of the invention is also improved. It is noted that the disclosed variants of the dynamic current steering mixer in FIG. 4A and FIG. 5A can also be used in the quadrature dynamic current steering mixer.

Figure 7B:
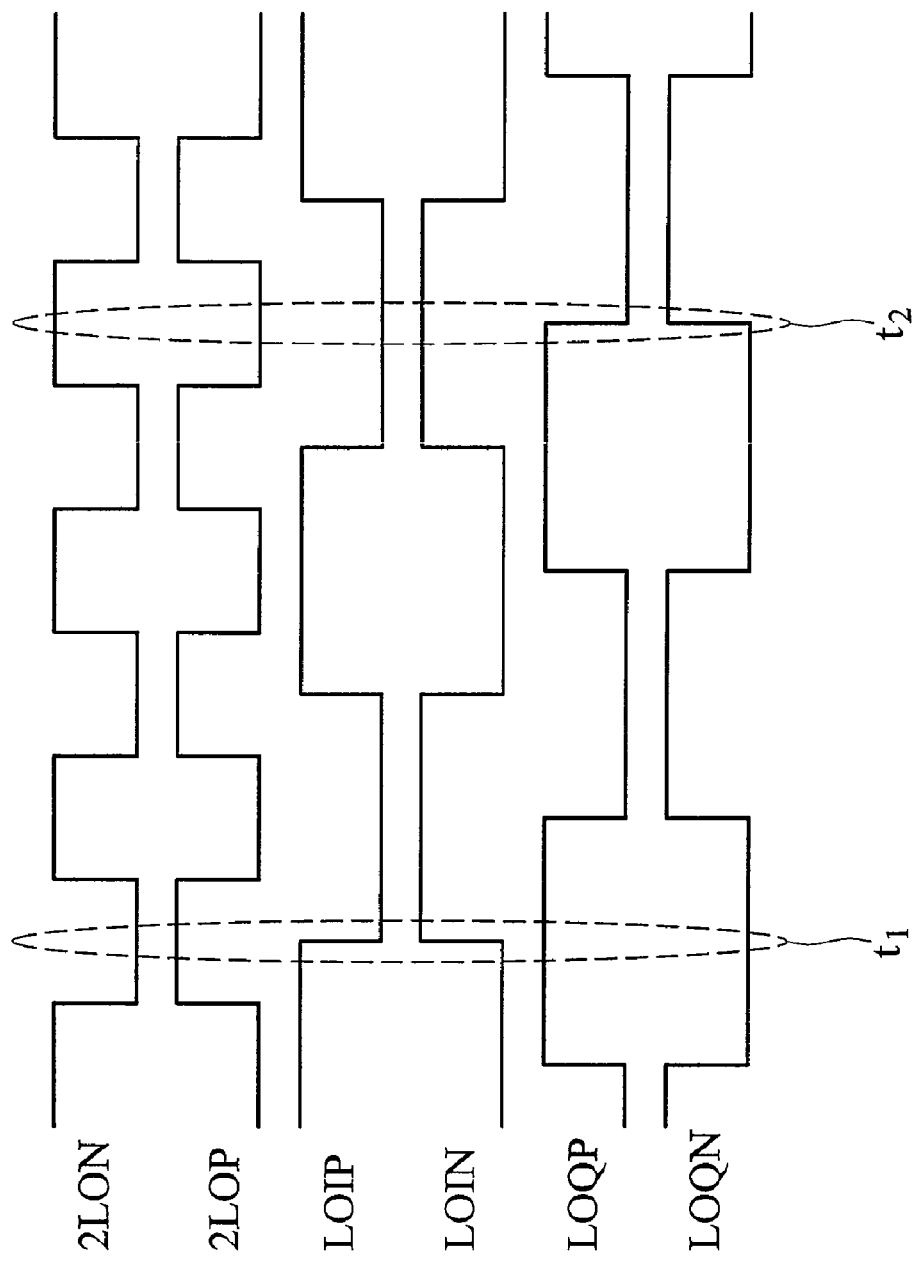
FIG. 7B is a schematic diagram showing waveforms of the local oscillator signals LOIP/LOIN and LOQP/LOQN and the control signals 2LOP and 2LON.

FIG. 7B is a schematic diagram showing waveforms of the local oscillator signals LOIP/LOIN and LOQP/LOQN and the control signals 2LOP and 2LON. In FIG. 7B, at a zero-crossing point t1 of the local oscillator signal LOIP/LOIN, since voltage level of the control signal 2LOP exceeds that of the reference voltage Vref, current Ia also exceeds current Ib. Meanwhile, voltage level of the reference voltage Vref also exceeds that of the control signal 2LON, and current Id thus exceeds current Ic. In other words, the currents Ia and Id consume most current at zero-crossing points of the local oscillator signal LOIP/LOIN and the currents Ib and Ic consume most current at zero-crossing points of the local oscillator signal LOQP/LOQN. As a result, current reuse is accomplished by combining current Ia with Id, and combining Ic with Ib.

Figure 8A:
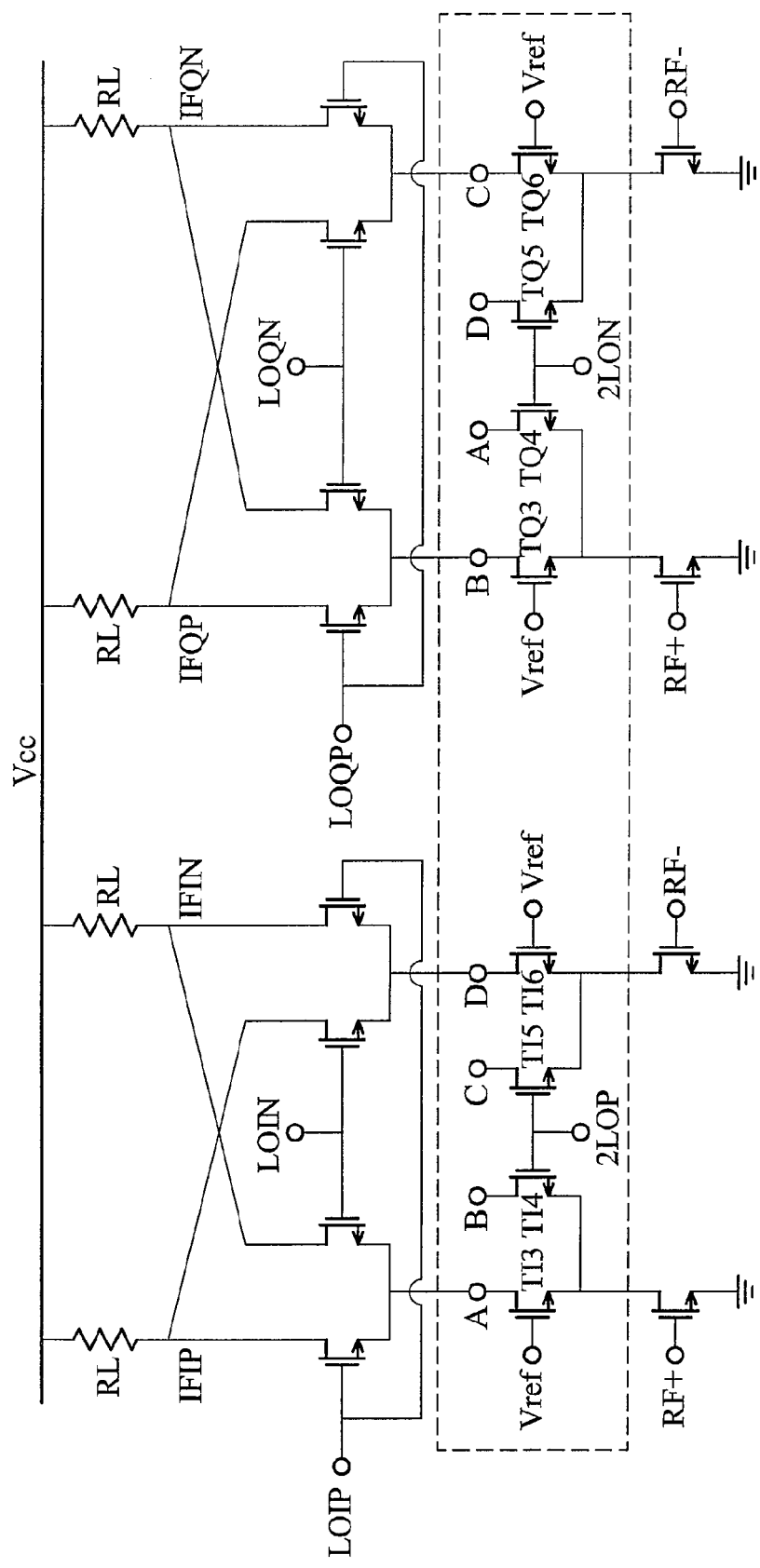
FIG. 8A is a circuit diagram of a variant of the quadrature dynamic current steering mixer according to an embodiment of the invention.

FIG. 8A is a circuit diagram of a variant of the quadrature dynamic current steering mixer according to an embodiment of the invention. The quadrature dynamic current steering mixer in FIG. 8A differs from that in FIG. 7A only in that drains of the NMOS transistors TI3, TI4, TI5, and TI6 in the I-Quad mixer 710 are respectively connected with drains of the NMOS transistors TQ4, TQ3, TQ6, and TQ5 in the Q-Quad mixer 760. Nodes A in FIG. 8A represent the drains of the NMOS transistors TI3 and TQ4 connected and nodes B in FIG. 8A represent the drains of the NMOS transistors TI4 and TQ3 are connected, and so forth. In such configuration, dynamic current steering and current combination are achieved and noise figure and current consumption are thus improved.

Figure 8B:
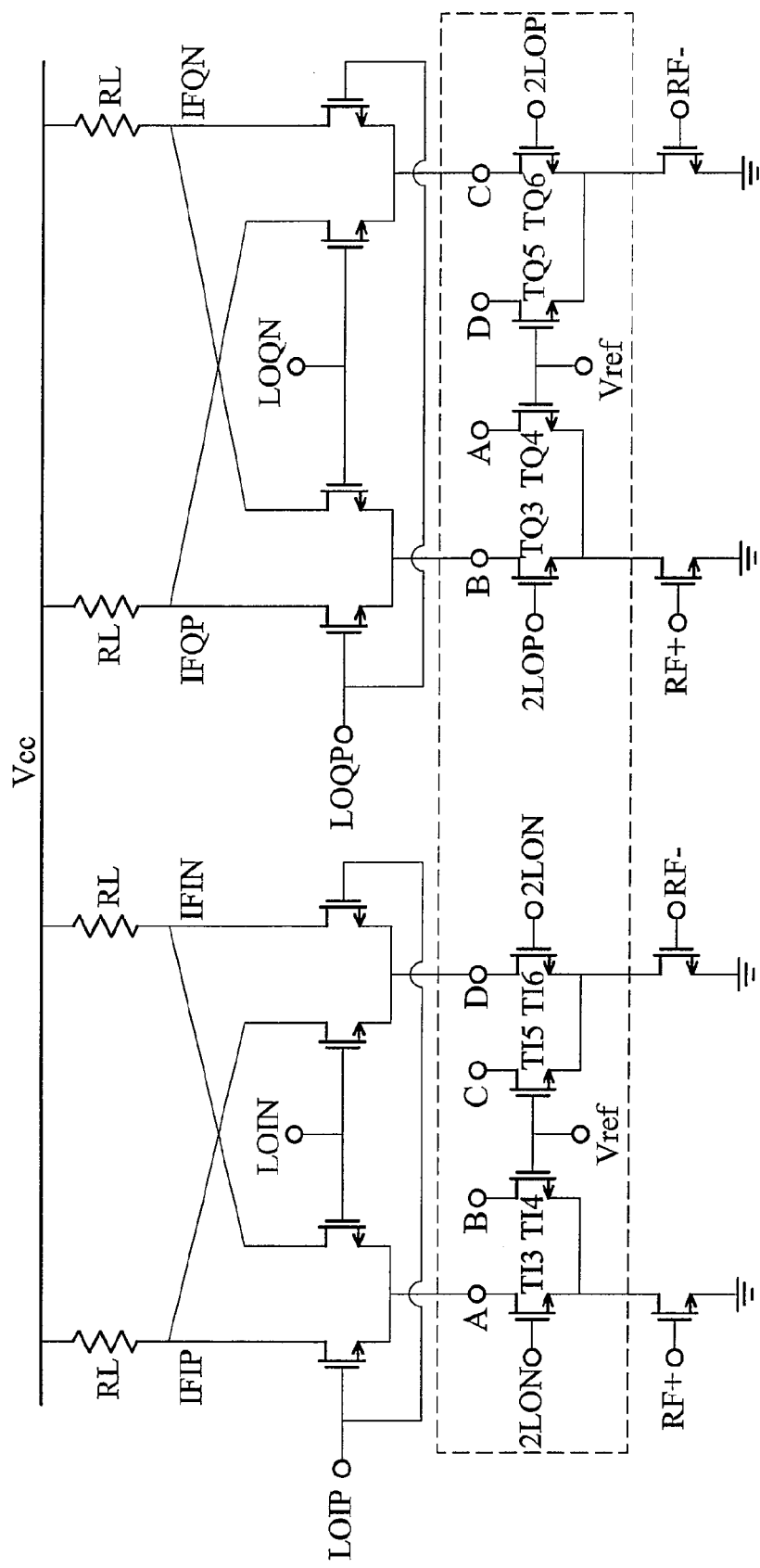
FIG. 8B is a circuit diagram of a variant of the quadrature dynamic current steering mixer in FIG. 8A.

FIG. 8B is a circuit diagram of a variant of the quadrature dynamic current steering mixer in FIG. 8A, differing only in that the I-Quad mixer 810 and the Q-Quad mixer 860 are both dynamic current steering mixer as disclosed in FIG. 4A.

While the invention has been described by way of example and in terms of preferred embodiment, it is to be understood that the invention is not limited thereto. Alternatively, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mixer, comprising:
    a Gilbert cell mixer core having first and second nodes, receiving a first differential input signal, and providing a differential output signal at the first nodes thereof;
    a pair of load devices respectively coupled between the first nodes of the Gilbert cell mixer core and a first fixed voltage;
    a dynamic current steering cell having third nodes coupled to the second nodes and fourth nodes; and
    a transconductor cell coupled between the fourth nodes and a second fixed voltage and receiving a second differential input signal;
    wherein the dynamic current steering cell alternately steers current of the transcondcutor cell to or away from the Gilbert cell mixer core;
    wherein the dynamic current steering cell comprises first transistors coupled between the third and fourth nodes thereof and second transistor coupled between the fourth nodes and a third fixed voltage, wherein gates of the first and second transistors respectively receive one and the other of a reference voltage and a steering voltage.

2. The mixer as claimed in claim 1 wherein frequency of the steering voltage is twice of that of the first differential input signal.

3. The mixer as claimed in claim 1, wherein the first and third fixed voltages are the same.

4. The mixer as claimed in claim 1, wherein the current of the transcondutor cell is steered off the Gilbert cell mixer core at zero-crossing points of the first differential input signal.

5. The mixer as claimed in claim 1, wherein the first and second fixed voltages are respectively one and the other of a supply voltage and a ground.

6. The mixer as claimed in claim 1, wherein the Gilbert cell mixer core comprises differential pairs of MOS transistors.

7. The mixer as claimed in claim 1, wherein the Gilbert cell mixer core comprises differential pairs of BJTs.

8. The mixer as claimed in claim 1, wherein each of the load devices comprises a resistor.

9. The mixer as claimed in claim 1, wherein the first and second fixed voltages are the same.

10. A quadrature dynamic current steering mixer, comprising:
first and second dynamic current steering mixers connected in parallel between first and second fixed voltages, each comprising: a Gilbert cell mixer core having first and second nodes, receiving a first differential input signal, and providing a differential output signal at the first nodes thereof;
a pair of load devices respectively coupled between the first nodes of the Gilbert cell mixer core and the first fixed voltage;
a dynamic current steering cell having third nodes coupled to the second nodes and fourth nodes; and
a transconductor cell coupled between the fourth nodes and the second fixed voltage and receiving a second differential input signal;
wherein the dynamic current steering cell alternately steers current of the transconductor cell to or away from the Gilbert cell mixer core;
wherein first differential input signals of the first and second dynamic current steering mixers have a phase difference of 90°;
wherein each of the first and second dynamic current steering cells comprises first transistors coupled between the third and fourth nodes thereof and second transistor coupled between the fourth nodes and a third fixed voltage, wherein gates of the first and second transistors respectively receive one and the other of a reference voltage and a steering voltage.

11. The quadrature dynamic current steering mixer as claimed in claim 10, wherein frequency of the steering voltage is twice of that of the first differential input signal.

12. The quadrature dynamic current steering mixer as claimed in claim 10, wherein the first and third fixed voltages are the same.

13. The quadrature dynamic current steering mixer as claimed in claim 10, wherein the current of each transcondutor cell is steered off the Gilbert cell mixer core at zero-crossing points of the first differential input signal.

14. The quadrature dynamic current steering mixer as claimed in claim 10, wherein the first and second fixed voltages are respectively one and the other of a supply voltage and a ground.

15. The dynamic current steering mixer as claimed in claim 10, wherein the first and second fixed voltages are respectively one and the other of a supply voltage and a ground.

16. The quadrature dynamic current steering mixer as claimed in claim 10, wherein each of the Gilbert cell mixer cores comprises differential pairs of MOS transistors.

17. The quadrature dynamic current steering mixer as claimed in claim 10, wherein each of the Gilbert cell mixer cores comprises differential pairs of BJTs.

18. The quadrature dynamic current steering mixer as claimed in claim 10, wherein each of the load devices comprises a resistor.

19. A quadrature dynamic current steering mixer, comprising:
first and second dynamic current steering mixers connected in parallel between first and second fixed voltages, each comprising: a Gilbert cell mixer core having first and second nodes, receiving a first differential input signal, and providing a differential output signal at the first nodes thereof;
a pair of load devices respectively coupled between the first nodes of the Gilbert cell mixer core and the first fixed voltage;
a dynamic current steering cell having third nodes coupled to the second nodes and fourth nodes; and
a transconductor cell coupled between the fourth nodes and the second fixed voltage and receiving a second differential input signal;
wherein the dynamic current steering cell alternately steers current of the transconductor cell to or away from the Gilbert cell mixer core;
wherein first differential input signals of the first and second dynamic current steering mixers have a phase difference of 90°;
wherein each of the first and second dynamic current steering cells comprises first transistors coupled between the third and fourth nodes thereof and second transistor coupled between the fourth nodes and the third nodes of the other dynamic current steering cell, wherein gates of the first and second transistors respectively receive one and the other of a reference voltage and a steering voltage.

20. The quadrature dynamic current steering mixer as claimed in claim 19, wherein frequency of the steering voltage is twice of that of the first differential input signal.

21. The quadrature dynamic current steering mixer as claimed in claim 19, wherein the first and third fixed voltages are the same.

22. A mixer, comprising:
a signal input;
an RF transconductance circuit, having a pair of transistors, configured to convert an input differential signal received at the signal input into a differential current;
a LO switching circuit, configured to switch the differential current between outputs of the mixer circuit at a rate determined by a differential LO signal; and
a current steering circuit, coupled between the RF transconductance circuit and the LO switching circuit, having a first, a second, a third, and a fourth transistors, wherein the first and second transistors configured to receive a control signal with twice the frequency of the LO signal, and the third and fourth transistors coupled together to a common node with a reference voltage.

23. A quadrature mixer, comprising:
an I-quadrature mixer and a Q-quadrature mixer, having an identical signal input, each comprising:
an RF transconductance circuit, having a pair of transistors, configured to convert an input differential signal received at the signal input into a differential current;
a LO switching circuit, configured to switch the differential current between outputs of the mixer circuit at a rate determined by a differential LO signal; and
a current steering circuit, coupled between the RF transconductance circuit and the LO switching circuit, having at least a first, a second, a third, and a fourth transistors, wherein the first and second transistors configured to receive a control signal with twice the frequency of the LO signal, and the third and fourth transistors coupled together to a common node with a reference voltage.

* * * * *